US006408422B1

(12) United States Patent
Hwang et al.

(10) Patent No.: US 6,408,422 B1
(45) Date of Patent: Jun. 18, 2002

(54) METHOD FOR REMAPPING LOGIC MODULES TO RESOURCES OF A PROGRAMMABLE GATE ARRAY

(75) Inventors: L. James Hwang, Menlo Park; Cameron D. Patterson, Los Gatos, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/234,010

(22) Filed: Jan. 19, 1999

Related U.S. Application Data

(63) Continuation-in-part of application No. 09/049,598, filed on Mar. 27, 1998, now Pat. No. 6,237,126.

(51) Int. Cl.$^7$ .............................................. G06F 17/50
(52) U.S. Cl. .................................. 716/3; 716/8; 716/17
(58) Field of Search .............................. 716/3, 10, 8, 9, 716/11, 16, 17

(56) References Cited

U.S. PATENT DOCUMENTS

| 4,554,625 A | 11/1985 | Otten ......................... 364/148 |
| 4,918,614 A | 4/1990 | Modarres et al. ........... 364/490 |
| 5,208,491 A | 5/1993 | Ebeling et al. ............... 326/41 |
| 5,311,443 A | 5/1994 | Crain et al. .................. 364/491 |
| 5,351,197 A | 9/1994 | Upton et al. ................. 364/491 |

(List continued on next page.)

FOREIGN PATENT DOCUMENTS

GB      2306728 A      5/1997

OTHER PUBLICATIONS

Natesan et al, "A Constructive Method for Data Path Area Estimation During High–Level VLSI Synthesis," IEEE, 1997, pp. 509–515.*

Jiang et al, "A New Self–Organization Strategy for Floorplan Design," IEEE, 1992, II–510–II–515.*

Hwang et al, "VHDL Placement Directives for Parametric IP Blocks," IEEE, 1999. pp. 284–285.*

(List continued on next page.)

Primary Examiner—Vuthe Siek
(74) Attorney, Agent, or Firm—LeRoy D. Maunu

(57) ABSTRACT

A method is provided for remapping logic modules to resources of a programmable gate array. Connections are specified between at least two logic modules, wherein each module has a respective floorplan that includes a set of circuit elements. A first set of resources of the programmable gate array is compared to a second set of resources, wherein the second set of resources are those resources required by the sets of circuit elements. If the first set of resources covers the second set of resources, the floorplans of the logic modules are combined into a single floorplan that maps to the first set of resources.

21 Claims, 6 Drawing Sheets

U.S. PATENT DOCUMENTS

| | | | |
|---|---|---|---|
| 5,394,338 A | 2/1995 | Shinohara et al. | 364/491 |
| 5,408,665 A | 4/1995 | Fitzgerald | 717/10 |
| 5,446,675 A | 8/1995 | Yoshimura | 364/489 |
| 5,491,640 A | 2/1996 | Sharma et al. | 364/488 |
| 5,499,192 A | 3/1996 | Knapp et al. | 364/489 |
| 5,519,627 A | 5/1996 | Mahmood et al. | 364/488 |
| 5,519,629 A * | 5/1996 | Snider | 364/490 |
| 5,519,630 A | 5/1996 | Nishiyama et al. | 364/490 |
| 5,568,395 A | 10/1996 | Huang | 364/489 |
| 5,594,657 A | 1/1997 | Cantone et al. | 395/500.17 |
| 5,602,754 A | 2/1997 | Beatty et al. | 716/6 |
| 5,604,680 A * | 2/1997 | Bamji et al. | 364/491 |
| 5,612,893 A | 3/1997 | Hao et al. | 364/491 |
| 5,615,124 A | 3/1997 | Hemmi et al. | 364/488 |
| 5,636,125 A | 6/1997 | Rostoker et al. | 700/121 |
| 5,640,327 A * | 6/1997 | Ting | 364/488 |
| 5,649,100 A | 7/1997 | Ertel et al. | 709/225 |
| 5,696,693 A | 12/1997 | Aubel et al. | 364/490 |
| 5,717,928 A | 2/1998 | Campmas et al. | 717/1 |
| 5,754,441 A | 5/1998 | Tokunoh et al. | 364/488 |
| 5,757,658 A | 5/1998 | Rodman et al. | 364/491 |
| 5,774,370 A | 6/1998 | Giomi | 716/4 |
| 5,818,254 A * | 10/1998 | Agrawal et al. | 326/39 |
| 5,818,728 A | 10/1998 | Yoeli et al. | 716/16 |
| 5,828,588 A | 10/1998 | Grant | 364/718 |
| 5,838,165 A | 11/1998 | Chatter | 326/38 |
| 5,838,583 A | 11/1998 | Varadarajan et al. | 364/491 |
| 5,841,663 A | 11/1998 | Sharma et al. | 364/490 |
| 5,892,678 A | 4/1999 | Tokunoh et al. | 364/488 |
| 5,937,190 A | 8/1999 | Gregory et al. | 395/704 |
| 5,946,219 A | 8/1999 | Mason et al. | 716/16 |
| 5,946,486 A | 8/1999 | Pekowski | 717/4 |
| 5,995,744 A | 11/1999 | Guccione | 395/500.44 |
| 6,023,742 A | 2/2000 | Ebeling et al. | 710/107 |
| 6,026,228 A | 2/2000 | Imai et al. | 716/18 |
| 6,059,838 A | 5/2000 | Fraley et al. | 717/1 |
| 6,078,736 A | 6/2000 | Guccione | 716/16 |
| 6,080,204 A | 6/2000 | Mendel | 716/7 |
| 6,167,363 A | 12/2000 | Stapleton | 703/14 |
| 6,170,080 B1 * | 1/2001 | Ginetti et al. | 716/18 |
| 6,216,252 B1 * | 4/2001 | Dangelo et al. | 716/1 |
| 6,216,258 B1 * | 4/2001 | Mohan et al. | 716/17 |
| 6,237,129 B1 * | 5/2001 | Patterson et al. | 716/8 |
| 6,243,851 B1 * | 6/2001 | Hwang et al. | 716/10 |

OTHER PUBLICATIONS

"Xilinx Libraries Guide", published Oct. 1995, pp. 4–71 to 4–97 available from Xilinx, Inc., 2100 Logic Drive, San Jose, CA 95124.

Robert Francis in "A Tutorial on Logic Synthesis for Look-up–Table Based FPGAs", pp. 40–47 of the Digest of Technical Papers, ICCAD–92, published in 1992 by IEEE Computer.

"The Programmable Logic Data Book 1998", pp. 4–5 to 4–69, published by Xilinx, Inc., located at 2100 Logic Drive, San Jose, California 95124.

Product Specification, "Virtex 2.5 V Field Programmable Gate Arrays, Version 1.1–Advance", published Nov. of 1998, pp. 1–43, and available from Xilinx, Inc., 2100 Logic Drive, San Jose, CA 95124.

"The Programmable Logic Data Book" copyright Sep. 1996, pp. 4–5 through 4–78, Xilinx, Inc., 2100 Logic Drive, San Jose, CA 95124.

"XC4000 Family Hard Macro Style Guide", published Sep. 3, 1991 and available from Xilinx, Inc., 2100 Logic Drive, San Jose, CA 95124.

"X–BLOC User Guide", published Apr., 1994, pp. 1–1 to 2–14 and 4–36 to 4–46, available from Xilinx, Inc., 2100 Logic Drive, San Jose, CA 95124.

"CORE Solutions Data Book", copyright 1997, pp. 4–3 to 4–4 and 2–3 to 2–91, available from Xilinx, Inc., 2100 Logic Drive, San Jose, CA 95124.

"Automated Layout of Integrated Circuits", pp. 113–195 of "Design Systems for VLSI Circuits", edited by G. De Micheli, A. Sangiovanni–Vincentelli, and P. Antognetti, published 1987, by Martinus Nijhoff Publishers.

D. Galloway, "The Transmogrifier C Hardware Description Language and Compiler for FPGAs", IEEE Symposium on FPGAs for Custom Computing Machines, Apr. 1995, pp. 136–144.

C. Iseli et al., "A C++ Compiler for FPGA Custom Execution Units Synthesis", IEEE Symposium on FPGAs for Custom Computing Machines, Apr. 1995, pp. 173–179.

P. Bondono et al., "Nautile: A Safe Environment for Silicon Compilation", Proceedings of the European Design Automation Conference, Mar. 1990, pp. 605–609.

J. Conway et al., "A New Temple Based Approach to Module Generation", 1990 IEEE International Conference on Computer–Aided Design, Nov. 1990, pp. 528–531.

I. Page, "The HARP Reconfigurable Computing System, Oxford University Hardware Compilation Group", Oct. 1994, pp. 1–7.

T. J. Sheffler et al., "An Object–Oriented Approach to Nested Data Parallelism", Fifth Symposium on the Frontiers of Massively Parallel Computation, Feb. 1995, pp. 203–210.

M. Weinhardt et al., "Pipeline Vectorization for Reconfigurable Systems", Seventh Annual IEEE Symposium on Field–Programmable Custom Computing Machines, Apr. 1999, pp. 52–62.

K. Pocek et al., "Optimizing FPGA–based Vector Product Designs, Symposium on Field–Programmable Custom Computing Machines", Apr., 1999, pp. 188–197.

Bin–Da Liu et al., "An Efficient Algorithm for Selecting Biparite Row or Column Folding of Programmable Logic Arrays", IEEE Transactions on Circuits and Systems, Jul., 1994, pp. 494–498.

S. A., Guccione et al., "A Data Parallel Programming Model for Reconfigurable Architectures", Apr., 1993, pp. 79–87.

K. Pocek et al., "JHDL–AN HDL for Reconfigurable Systems, FPGA for Custom Computing Machines", Apr. 1998, pp. 175–184.

B. Hutchings et al., "A CAD Suite for High–Performance FPGA Design", IEEE Symposium on Field–Programmable Custom Computing Machines, Apr., 1999, pp. 12–24.

S. C. Goldstein et al., PipeRench: "A Reconfigurable Architecture and Compiler", Apr., 2000, pp. 70–77.

S. Tarafdar et al., "Integrating Floorplanning In Data–Transfer Based on High Level Synthesis", 1998 IEEE / ACM Conference on Computer–Aided Design, pp. 412–417.

K. Bazargan et al., Nostradamus: A Floorplanner of Uncertain Designs, IEEE Transactions on Computer–Aided Design of Integrated Circuits and Systems, 1999, pp. 389–397.

Tsareff et al., "An Expert System Approach to Parameterized Module Synthesis," IEEE, pp. 28–36. No date.

Mohanty et al., "Scuba: An HDL Data–Path/Memory Module Generator for FPGAs," IEEE, pp. 135–142. No date.

Andersson et al., "Interaction Semantics of a Symbolic Layout Editor for Parameterized Modules," IEEE, pp. 1096–1106. No Date.

Kim et al., "An Analog Layout Floorplanner Using its Parameterized Module Layout Structure," IEEE, pp. 397–400. No date.

M. Evered et al., Genja—A New Proposal for Parameterised Types in Java, Technology of Object–Oriented Languages and Systems, Nov. 1997, pp. 181–193.

M. Odersky et al., Leftover Curry and reheated Pizza: How functional programming nourishes software reuse, Fifth International Conference on, Jun. 1998, pp. 2–11.

B. Djafri et al., OOVHDL: Object Oriented VHDL, VHDL International Users' Forum, Oct. 1997, pp. 54–59.

W. Wolf, How to Build a Hardware Description and Measurement System on an Object–Oriented Programming Language, IEEE Transactions on Computer–Aided Design, Mar. 1989, pp. 288–301.

P. Bellows et al., JHDL—An HDL for Reconfigurable Systems, IEEE Symposium on FPGAs for Custom Computing Machines, Apr. 1998, pp. 175–184.

D. W. Knapp et al., The ADAM Design Planning Engine, Computer–Aided Design of Integrated Circuits and Systems, Jul. 1991, pp. 829–846.

J. Granacki et al., The ADAM Advanced Design Automation System, ACM/IEEE Conference on Design Automation, Apr. 1985, pp. 727–730.

Wayne Wolf, An Object–Oriented, Procedural Database for VLSI Chip Planning, ACM/IEEE Conference on Design Automation, Apr. 1986, pp. 744–751.

Yamazaki, Takao et al., "A Top Down for Data Path Design", Sep. 1993, Proceedings of the Sixth Annual IEEE International ASIC Conference and Exhibit, pp. 266–269.

Evolution User's Guide [online] Morphologic., [retrieved on Sep. 1, 1999]. Retrieved from the Internet: http://www.morphologic.com.

Mencer, O. et al., PAM–Blox: High Performance FPGA Design for Adaptive Computing, FPGAs for Custom Computing Machines, Apr. 1998, proceedings. IEEE Symposium on., pp. 167–174.

Kelem., S. H., et al., Shortening the Design Cycle for Programmable Logic, IEEE Design & Test of Computers, Dec. 1992, pp. 40–50.

Usami, K. et al., Hierarchical Symbolic Design Methodology for Large–Scale Data Paths, IEEE Journal of Solid State Circuits, Mar. 1991, pp. 381–385.

Engel, R. et al., Making Design Patterns Explicit in FACE, Proceedings of the 6th European Conference, Sep. 1997, pp. 94–110.

N. Gefland, Teaching Data Structure Design Patterns, Proceedings of the 29th SIGCSE Technical Symposium, Feb. 1998, pp. 331–335.

Kortright, E.V., Modeling and Simulation with UML and Java, Simulation Symposium, Proceedings., 30th Annual, Apr. 1997, pp. 43–48.

Kelem, S. H. et al., Context–based ASIC Synthesis, Euro ASIC '92, Proceedings., pp. 226–231.

Brasen, D.R., MHERTZ: A New Optimization Algorithm for Floorplanning and Global Routing, Design Automation Conference, Jun. 1990, Proceedings., 27th ACM/IEEE.

Smith, William D. et al., Flexible Module Generation in the FACE Design Environment, IEEE International Conference on Computer–Aided Design, Nov. 1988, pp. 396–399.

Lechner E. et al: "The Java Environment for Reconfigurable Computing" Field–Programmable Logic and Applications. 7th International Workshop, FPL '97. Proceedings, London, UK, Sep. 1–3, 1997, pp. 284–293, XP002086682 ISBN 3–540–63465–7, 1997, Berlin, Germany, Springer–Verlag, Germany.

Pottier B. et al: "Revisiting Smalltalk–80 blocks: a logic generator for FPGAs", Proceedings. IEEE Symposium on FPGAs for Custom Computing Machines (CAT. No. 96TB100063), Napa Valley, CA, USA, Apr. 17–19, 1996, pp. 48–57, XP002103589 ISBN 0–8186–7548–9, 1996, Los Alamitos, CA, USA.

Swamy S. et al.: "00–VHDL Object–Oriented Extensions to VHDL", Computer vol. 28, No. 10, Oct. 1, 1995, pp. 18–26 XP000535917.

Dekker R. et al. "HDL Synthesis for FPGA Design" Electronic Engineering, vol. 66, No. 814, Oct. 1, 1994, p. S43/44, 46 XP000471392.

Maxfield C: "LPMS: High–Level Design Uses Low–Level Techniques" EDN Electrical Design News, vol. 41, No. 10, May 9, 1996, pp. 125–131, XP00597964.

Hwang J. et al.: "Generating Layouts for Self–Implementing Modules", Field–Programmable Logic and Applications. From FPGAs to Computing Paradigm. 8th International Workshop, FPL, Aug. 31, 1998, pp. 525–529, XP002103590, ISBN 3–540–64948–4, 1998, Berlin, Germany, Springer–Verlag, Germany.

* cited by examiner

METHOD FOR REMAPPING LOGIC MODULES TO RESOURCES OF A PROGRAMMABLE GATE ARRAY

CROSS-REFERENCE TO RELATED APPLICATIONS

The present invention is a continuation-in-part of the patent application entitled, "METHOD FOR CONSTRAINING CIRCUIT ELEMENT POSITIONS IN STRUCTURED LAYOUTS," by Patterson et al., having Ser. No. 09/049,598 and a filing date of Mar. 27, 1998, and assigned to the assignee of the present invention, the content of which is incorporated herein by reference now U.S. Pat. No. 6,237,126.

FIELD OF THE INVENTION

The present invention generally relates to mapping logic to resources in a programmable logic device, and more particularly to remapping combinations of previously mapped logic modules.

BACKGROUND OF THE INVENTION

Field programmable gate arrays (FPGAs), first introduced by Xilinx, Inc. in the 1980's, are becoming increasingly popular devices for use in electronics systems. For example, communications systems employ FPGAs in large measure for their re-programmability. In general, the use of FPGAs continues to grow at a rapid rate, because they permit relatively short design cycles, reduce costs through logic consolidation, and offer flexibility in their re-programmability. One such FPGA, the Xilinx XC4000™ Series FPGA, is described in detail in pages 4–5 through 4–69 of the Xilinx 1998 Data Book entitled "The Programmable Logic Data Book 1998", published in 1998 and available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

As FPGA designs increase in complexity, they reach a point at which the designer cannot deal with the entire design at the gate level. Where once a typical FPGA design comprised perhaps 5,000 gates, FPGA designs with 50,000 gates are now common, and FPGAs supporting over 300,000 gates are available. To deal with this complexity, circuits are typically partitioned into smaller circuits that are more easily handled. Often, these smaller circuits are divided into yet smaller circuits, imposing on the design a multi-level hierarchy of logical blocks.

Libraries of pre-developed blocks of logic have been developed that can be included in an FPGA design. Such library modules include, for example, adders, multipliers, filters, and other arithmetic and DSP functions from which complex designs can be readily constructed. The use of pre-developed logic blocks permits faster design cycles by eliminating the redesign of circuits. Thus, using blocks of logic from a library may reduce design costs. However, the circuit that results when combining predefined logic blocks may have sub-optimal circuit performance and may use more resources of the programmable gate array than is desirable. Thus, the use of predefined logic blocks to lower design costs may conflict with the objectives of optimizing performance and conserving resources of the programmable gate array.

A method that address the aforementioned problems, as well as other related problems, is therefore desirable.

SUMMARY OF THE INVENTION

In various embodiments, the invention provides a method for remapping logic modules to resources of a programmable gate array. Whereas conventional methods that support reuse of logic modules are believed to provide functionally complete circuits at the expense of performance and resource usage, the present method supports logic reuse and produces circuits with enhanced performance and reduced resource requirements.

In accordance with one embodiment, connections are specified between at least two logic modules, wherein each module has a respective floorplan that includes a set of circuit elements. A first set of resources of the programmable gate array is compared to a second set of resources, wherein the second set of resources are those resources required by the sets of circuit elements. If the first set of resources covers the second set of resources (i.e., if the first set of resources includes at least the same resources as the second set), the floorplans of the logic modules are combined into a single floorplan that maps to the first set of resources.

The invention provides increased circuit performance by producing a circuit floorplan having path lengths less than the path lengths resulting from simple connections between the logic modules. In other words, combining the logic of the logic modules into a single combinational network and producing therefrom a single floorplan improves performance and reduces resource usage.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings, in which.

Figure 1:
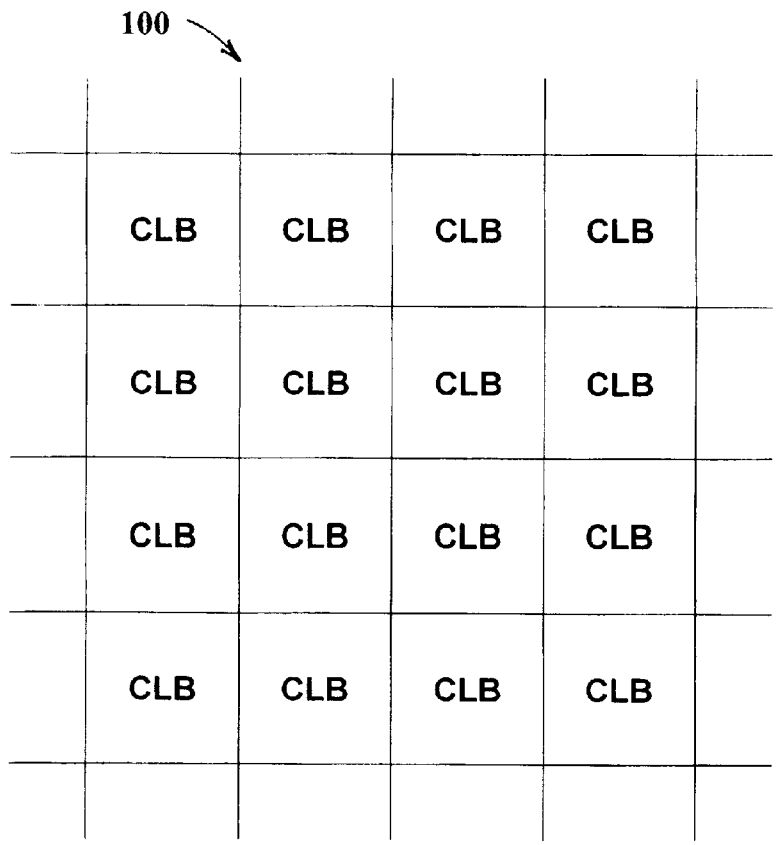
FIG. 1 is a block diagram of a partial programmable gate array.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a variety of systems for designing applications for programmable logic devices. The present invention has been found to be particularly applicable and beneficial for design systems used to develop applications for programmable gate arrays having configurable logic blocks. While the present invention is not so limited, an appreciation of the present invention is presented by way of specific examples, in this instance with a programmable gate array having a array of configurable logic blocks.

FIG. 1 is a block diagram of a partial programmable gate array. Programmable gate array 100 includes a plurality of configurable logic blocks (CLBS) arranged in an array. The CLBs are typically surrounded by a ring of programmable input/output blocks ("IOBs", not shown), and the CLBs and IOBs are interconnected by a programmable interconnect structure (not shown). The CLBs, IOBs, and interconnect structure are typically programmed by loading a stream of configuration data (bitstream) into internal configuration memory cells that define how the CLBs, IOBs, and interconnect structure are configured. The configuration data may be read from memory (e.g., an external PROM) or written into the FPGA by an external device. The collective states of the individual memory cells then determine the function of the FPGA.

Example programmable gate arrays include the XC4000 and Virtex™ FPGAs from Xilinx. Virtex FPGAs are described in detail in pages 1–43 of the product specification entitled "Virtex™ 2.5 V Field Programmable Gate Arrays, Version 1.1—ADVANCE", published in November of 1998 and available from Xilinx, Inc., which pages are incorporated herein by reference.

Figure 2:
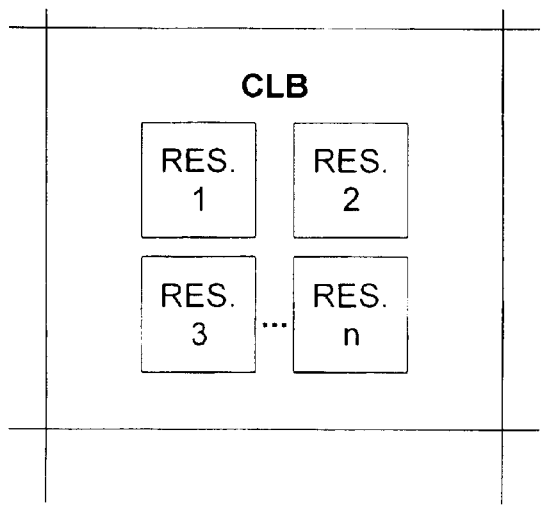
FIG. 2 is a block diagram that illustrates configurable resources within a CLB.

FIG. 2 is a block diagram that illustrates configurable resources within a CLB. The type and number of resources depends on the particular programmable logic device. In a Virtex FPGA, for example, the resources include four 4-input lookup tables (LUTs), four storage elements, an assortment of multiplexers for programmably combining outputs of the LUTs, arithmetic carry logic, and two 3-state drivers.

A design embodied in a logic module is mapped to the resources in one or more CLBs. Such logic modules may be specified in VHDL or Verilog HDL, for example. Libraries of blocks of logic have been developed for reuse in various FPGA designs. Such library modules typically include adders, multiplexers, and other well-known logic functions. Library modules permit faster design cycles by eliminating the redesign of circuits. Furthermore, such modules are typically well tested, thereby making it easier to develop a reliable complex design.

Figure 3:
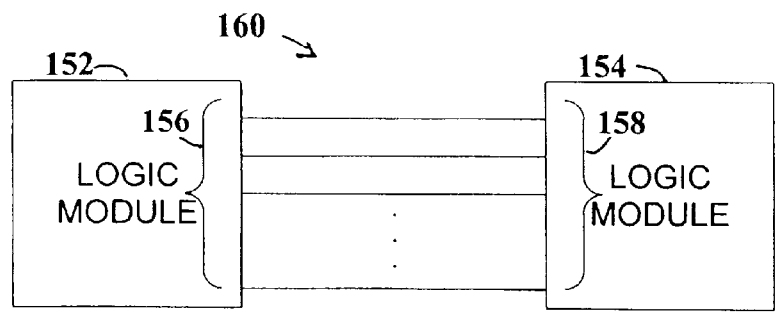
FIG. 3 is a block diagram of a pair of logic modules.

FIG. 3 is a block diagram of a pair of logic modules 152 and 154. Logic module 152 embodies a first example function and logic module 154 embodies a second example function, and both modules represent previously developed modules from a library.

The logic modules 152 and 154 include predefined ports 156 and 158, respectively. While not shown, it will be appreciated that either or both of modules 152 and 154 could include additional input and output ports for connecting to additional logic. By combining logic modules 152 and 154 from a library to construct a circuit 160, development costs can be reduced by not having to reinvent the functions of modules 152 and 154.

To offer enhanced performance, some library modules have fixed sizes, shapes, and relative location restrictions. For example, relationally placed macros (RPMs) from Xilinx have fixed sizes and shapes. RPMs are described in pages 4–96 and 4–97 of the "Xilinx Libraries Guide," published October 1995 and available from Xilinx, Inc., which pages are incorporated herein by reference. An RPM is a schematic that includes constraints defining the order and structure of the underlying circuits. The location of each element within the RPM is defined relative to other elements in the RPM, regardless of the eventual placement of the RPM in the overall design. For example, an RPM might contain 8 flip-flops constrained to be placed on 4 CLBs in a vertical column. The column of CLBs can then be placed anywhere in the programmable gate array.

Although this coordinate-based method of specifying relative locations is a useful way to represent positions, two or more modules may be more efficiently mapped, in terms of performance and space, if the separate functions specified by the modules can be combined and then mapped to a lesser set of resources.

Figure 4:
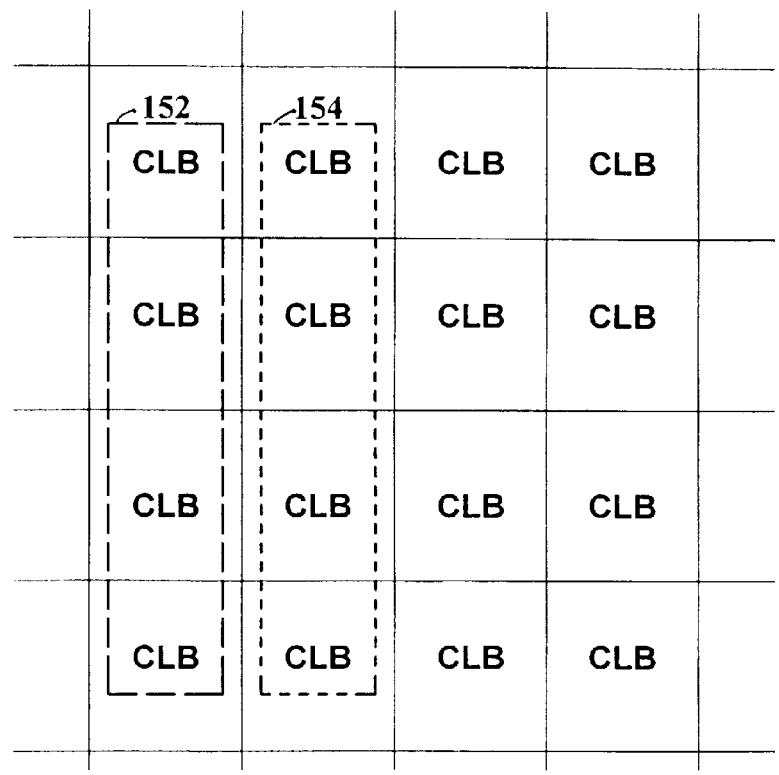
FIG. 4 illustrates a conventional mapping of the logic modules of FIG. 3.

For example, FIG. 4 illustrates a conventional mapping of logic modules 152 and 154 where, for example, logic module 152 is assumed to have been decomposed into a vector having a column orientation and a bottom-to-top direction, and module 154 is assumed to have a column orientation and a bottom-to-top direction. Circuit 160 (FIG. 3) is mapped to 2 columns of CLBs, each column spanning 4 rows. The total number of CLBs consumed in the mapping is 8.

Recall that modules 152 and 154 were taken from a library of predefined modules to save time in constructing the circuit 160. However, circuit 160 consumes 8 CLBs as shown in FIG. 4, and may implement a combinational circuit whose path length results in sub-optimal circuit performance. It will be appreciated that if the functions of modules 152 and 154 could be combined and mapped to a single set of resources instead of two sets of resources, the path length and the number of resources required by circuit 160 could be reduced. However, it must be considered that if significant human intervention is required in combining the modules, the resource savings may be outweighed by the cost of generating a new module. It would therefore be desirable to provide an automated method to combine the modules.

Figure 5:
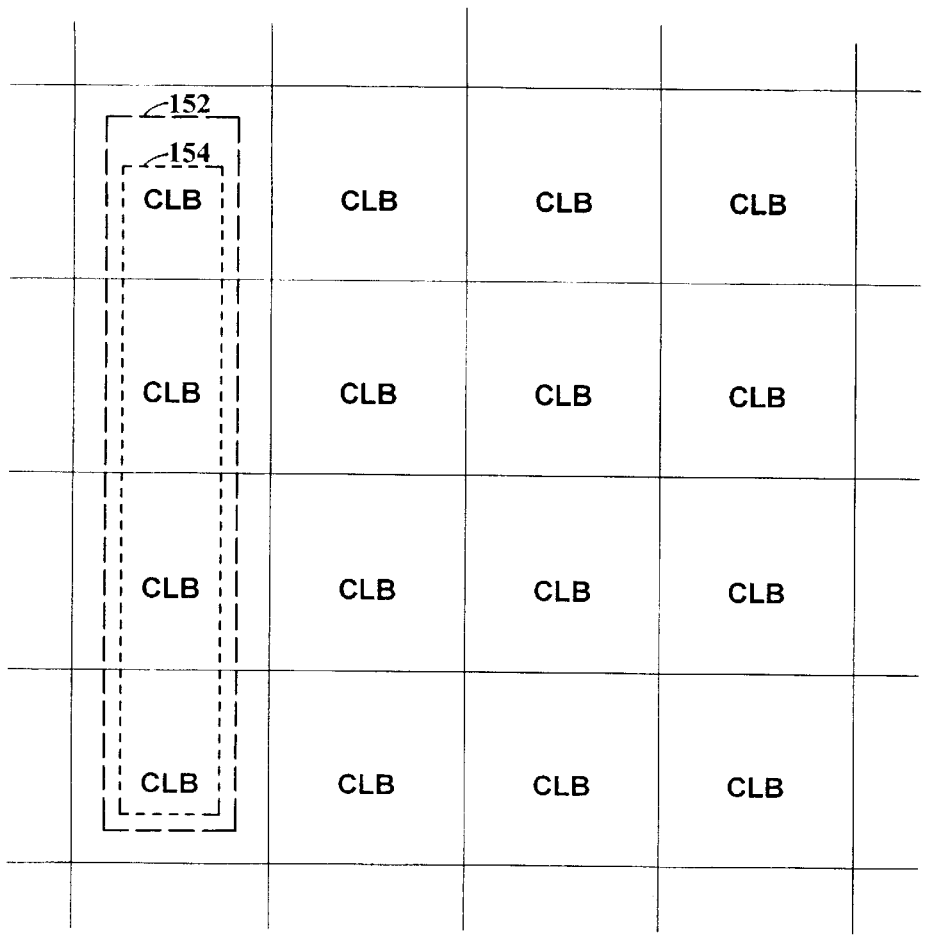
FIG. 5 is a block diagram of a programmable gate array having the functions of the modules of FIG. 3 combined and mapped to a single set of CLBs.

FIG. 5 is a block diagram of a programmable gate array having the functions of modules 152 and 154 combined and mapped to a single set of CLBs. As compared to the mapping of FIG. 4, the mapping of FIG. 5 consumes 4 CLBS instead of 8. It will be appreciated that combining and mapping the modules 152 and 154 to the single set of CLBs reduces the length of the longest path through the combinational circuit, thereby improving circuit performance. In addition, no interconnect resources are required to connect module 152 to module 154, since both are mapped to the same CLBs.

Figure 6:
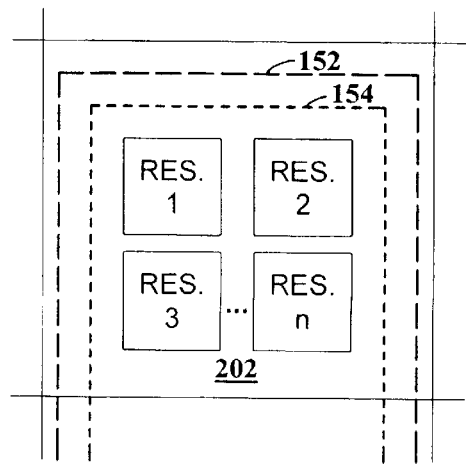
FIG. 6 is a further illustration of the combined mapping of modules.

FIG. 6 is a further illustration of the combined mapping of modules 152 and 154. Modules 152 and 154 are mapped to resources 1 through n of CLB 202

While the example of FIGS. 4–6 assumes that logic modules 152 and 154 are column vectors, it will be appreciated that the teachings of the present invention could also be applied to modules having shapes that span multiple columns, one or more rows, as well as modules having shapes as described in the above-referenced patent application and those having irregular shapes.

Figure 7:
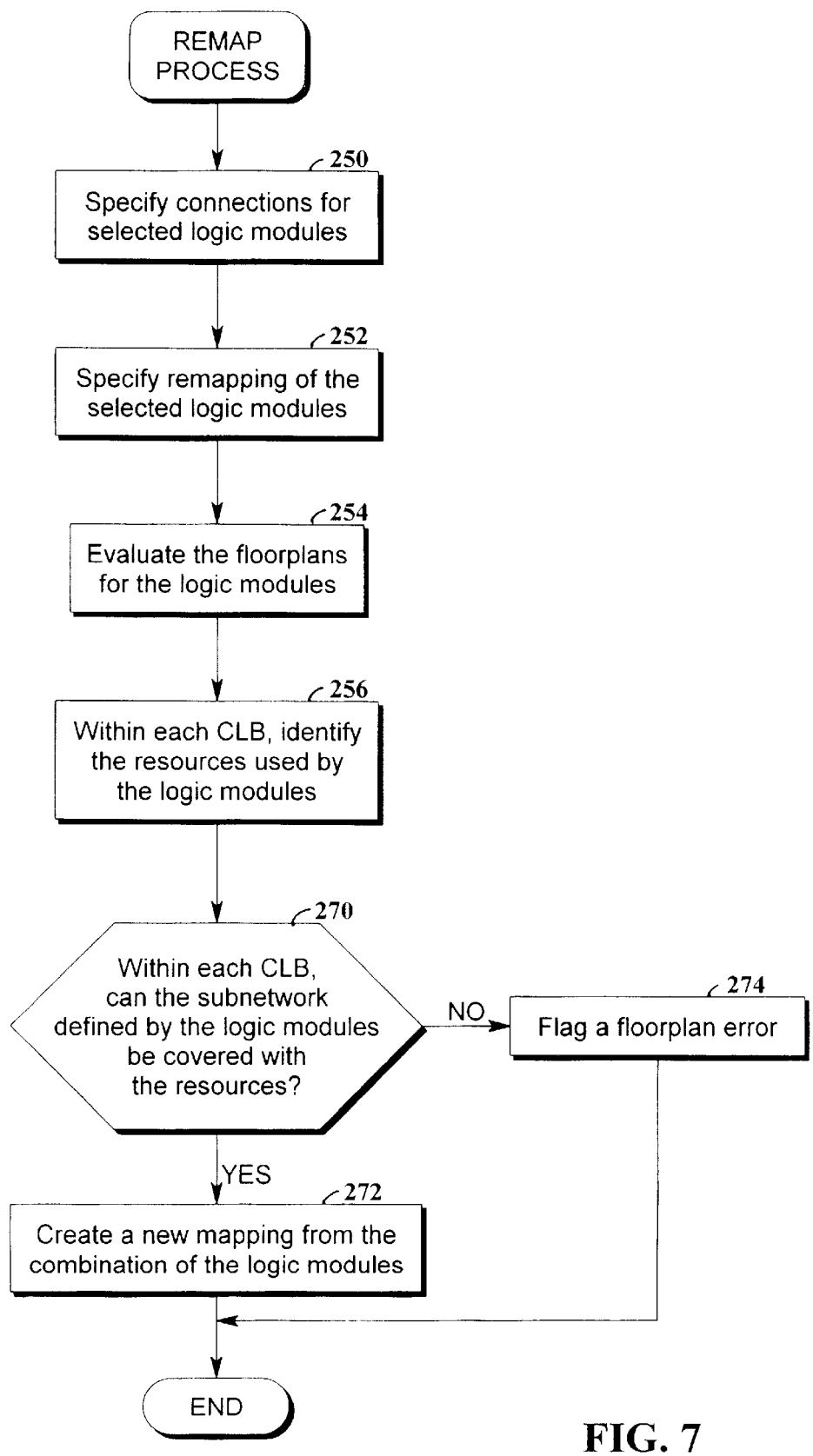
FIG. 7 is a flowchart of a process for remapping logic modules in accordance with an example embodiment of the invention.

FIG. 7 is a flowchart of a process for remapping logic modules in accordance with an example embodiment of the invention. The process generally comprises evaluating the floorplans of, and resources consumed by, modules selected to be remapped, and remapping the modules if a selected set of resources can cover the remapped modules.

Logic modules are remapped in response to specifying, in HDL, for example, which logic modules comprise a remap template. The remap template specifies how to compose a module from two or more sub-modules, for example, where the sub-modules are part of a predefined library.

The process of FIG. 7 may be better understood with reference to a particular example. Consider the following HDL pseudocode:

```
// input select: mux between B and C, based on "sel"
// input add the mux'd output to signal A.
module input_select_adder(int width, Net A, Net B, Net
   C, Net sel, Net out)
{
  addPort("A", IN, width);
  addPort("B", IN, width);
  addPort("C", IN, width);
  addPort("sel", IN, 1);
  addPort("out", OUT, width);
  // create new net from Mux outputs to adder input
  Net mux_out=addNet("mux_out", width);
  RemapTemplate remap=new RemapTemplate( );
  remap.addChild(new Mux(width, B, C, sel, mux_
      out));
  remap.addChild(new Adder(width, A, mux_out, out));
  remap.evaluate();
```

The above pseudocode specifies an input select adder having data input ports A, B, and C, an output port out, and a selection input sel. Based on the sel signal, a multiplexer selects between inputs B and C, and an adder adds signal A to the selected one of signals B and C.

The RemapTemplate statement creates a new instance of a remap template, called remap. The remap template is created to specify which logic modules are to be considered for remapping. A Mux and an Adder module are specified with the remap.addChild( ) statements as the modules to remap, and the remap.evaluate( ) function remaps the modules if the resources can cover the combination of the Mux and Adder.

Figure 8A:
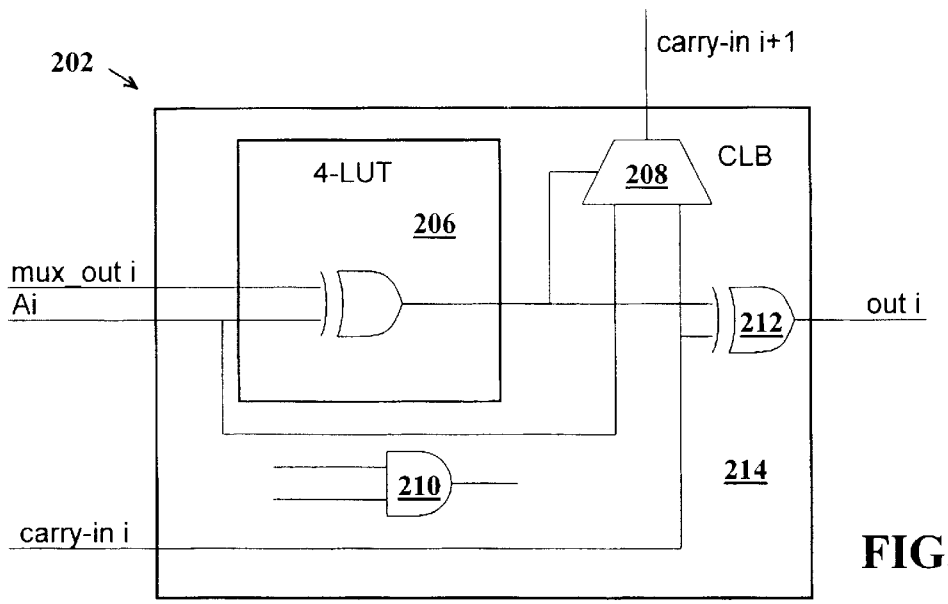
FIGS. 8A and 8B are schematic diagrams that illustrate a bit-slice of an adder and a bit-slice of a multiplexer.
Figure 8B:
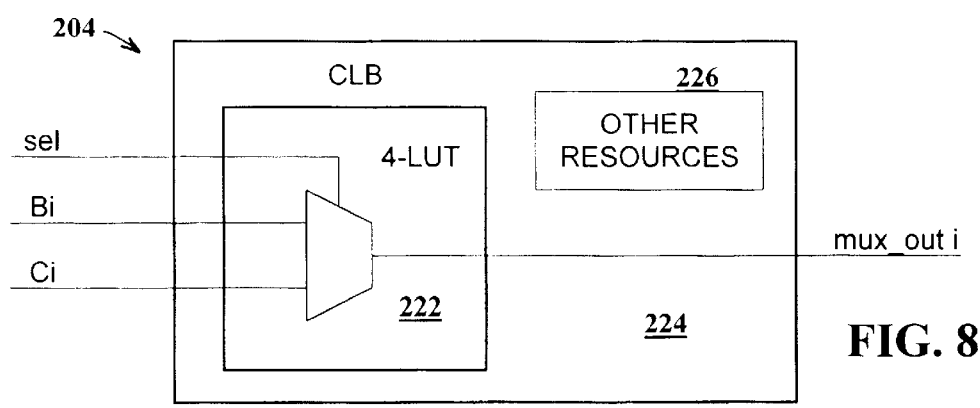

FIGS. 8A and 8B are schematic diagrams that illustrate an adder bit-slice 202 and a multiplexer bit-slice 204 of the pseudocode example set forth above. (For brevity, the terms adder and adder bit-slice are used interchangeably herein. The terms multiplexer and multiplexer bit-slice are also used interchangeably.) Adder 202 (FIG. 8A) is implemented with three resources of a CLB: 4-input lookup table (4-LUT) 206, carry-out multiplexer 208, and XOR gate 212. It will be appreciated that AND gate 210, shown only for illustrative purposes, is available in CLB 214, but is not used for adder 202. For this example, CLB 214 is assumed to have available these four resources. Multiplexer 204 (FIG. 8B) uses only 4-LUT 222 of CLB 224. Block 226 represents the other resources of CLB 224 that are not used by multiplexer 204.

Returning now to FIG. 7, the remap process begins with the specification of a circuit that comprises two or more modules, as set forth by step 250. The example HDL pseudocode above illustrates an input_select_adder that connects an adder and a multiplexer from a library of predefined modules. Without the remapping of the present invention, the floorplan of the input_select_adder may be that shown in FIG. 4 for a 4-bit input_select_adder. Dashed block 152 may be the mapping of multiplexer 204, and dashed block 154 may be the mapping of adder 202.

At step 252 of FIG. 7, remapping of the modules is specified. In the pseudocode, the remapping is specified with the creation of a remap template, remap, having as constituent "children" adder 202 and multiplexer 204, for example.

In the example embodiment, the modules that comprise a remap template are remapped when a netlist is generated. The remap process is part of an overall process of netlist generation including obtaining parameters for parameterized modules and generating a netlist. This process is also referred to as "elaboration" or "generation" of the netlist.

At step 254, the floorplans of the children of the remap template are evaluated. That is, the size, shape, and relative location coordinates of the children modules are evaluated to construct a template of resources that covers the children when considered individually. For example, if example adder 202 and multiplexer 204 are each 4 bits wide and have column floorplans, the constructed template is a column of 4 CLBs. Conceptually, the remap template may be viewed as a collection of resources that covers the specified children, when the children are considered individually.

The resources required by each of the children are tabulated on a CLB-by-CLB basis at step 256. In an example embodiment, the resources may be tabulated by constructing respective tile matrices for the children. The shapes and sizes of the tile matrices correspond to the template constructed for the children.

Figure 9:
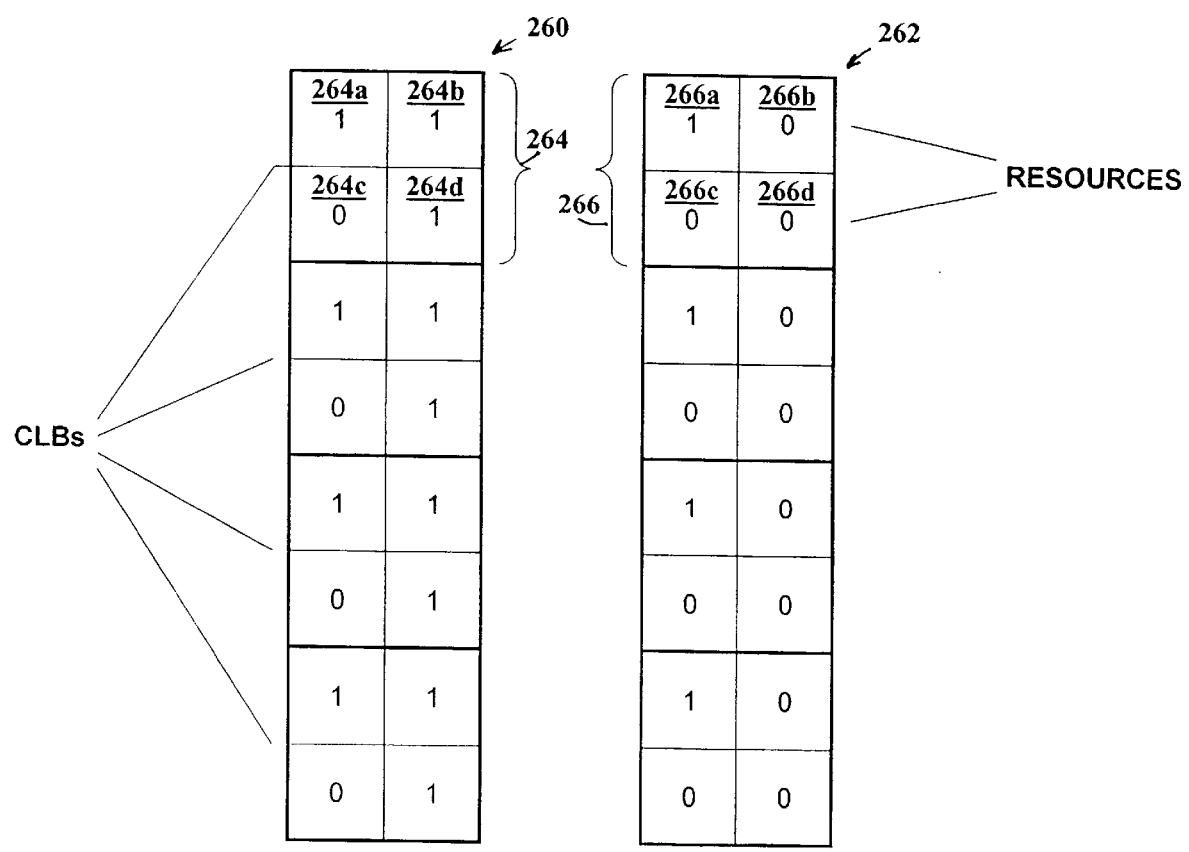
FIG. 9 illustrates tile matrices for the example adder and multiplexer.

FIG. 9 illustrates tile matrices for example adder 202 and multiplexer 204. Tile matrix 260 corresponds to adder 202, and tile matrix 262 corresponds to multiplexer 204. Each tile represents a CLB, for example, and includes a matrix of cells with values indicating which resources are required. The collection of tiles for a child module is referred to as the "tile matrix" for the module. It will be appreciated that a tile matrix may assume shapes other than the column illustrated for the example adder. For example, the tile matrix may be comprised of one or more columns or rows, which are either adjacent or disjoint. A tile matrix may also be comprised of a collection of tiles whose shape is not rectangular.

Each cell within a matrix represents a resource of the respective CLB, and the value of the cell represents whether the resource is required by the module. The example CLBs represented by the tiles of tile matrices 260 and 262 include 4 resources. For example, each CLB may include a LUT, a multiplexer, an AND gate, and an XOR gate such as those illustrated in CLB 214 of FIG. 8A.

The particular values in the cells of tile matrices 260 and 262 are intended to represent the resources required for adder 202 and multiplexer 204 of FIGS. 8A and 8B, respectively. For example, cells 264a, 264b, 264c, and 264d of tile 264 respectively correspond to LUT 206, multiplexer 208, AND gate 210, and XOR gate 212 of CLB 214. Since adder 202 requires all the resources except AND gate 210, cells 264a, 264b, and 264d are set to '1', and cell 264c is set to '0'. The values in cells 266a, 266b, 266c, and 266d of tile 266 indicate that multiplexer 204 only requires LUT 222 in CLB 224. Thus, cells 266b, 266c, and 266d are set to '0'. Since example adder 202 is replicated in a column of CLBs, the values in corresponding cells of each of the tiles in tile matrix 260 are the same. The same rule holds true for multiplexer 204 and the tiles in tile matrix 262.

Returning now to FIG. 7 at step 270, the process determines whether the child logic modules of a remap template can be remapped. In the example embodiment, the process compares the resource requirements of the logic modules on a CLB-by-CLB basis to the resources available in a CLB of the remap template. If within a CLB of the remap template, the resources can cover the sub-network defined by the corresponding CLBs of the child modules, a new mapping is created at step 272. Otherwise, a floorplan error is flagged at step 274.

For example adder 202 and multiplexer 204 (FIGS. 8A and 8B) and the associated tile matrices 260 and 262 (FIG. 9), it can be seen that there are no resource conflicts for the multiplexer, AND gate, and XOR gate of a CLB. Specifically, adder 202 requires multiplexer 208 and XOR gate 212, but multiplexer 204 only requires LUT 222. It will be appreciated that in general, any conflict for resources such as a multiplexer, an AND gate, or an XOR gate precludes remapping.

Where there is no conflict relative to the multiplexer, AND gate, or XOR gate of a CLB, consideration can be given to whether the LUT of the remap template covers the combinational network defined by the child modules at that CLB. Consider, for example, adder 202 and multiplexer 204. The output of LUT 206 of the adder 202 is defined as: Ai XOR mux_out i. The output of LUT 222 of multiplexer 204 is defined as: mux_out i=select (sel, Bi, Ci), where sel, Bi, and Ci are inputs to a select function, and the state of the sel signal controls selection of either signal Bi or Ci. Thus, the output of the combined network can be expressed as: Ai XOR select (sel, Bi, Ci). From this expression, it can be seen that there are four inputs and one output, the inputs being: Ai, sel, Bi, and Ci. Therefore, the sub-network defined by adder 202 and multiplexer 204 can be remapped into a single CLB. For the general case of determining whether available resources cover a particular network, conventional covering algorithms are suitable. One such algorithm that can be used with the methods of the invention is described by Robert Francis in "A Tutorial on Logic Synthesis for Lookup-Table Based FPGAs", pages 40–47 of the Digest of Technical Papers, ICCAD-92, published in 1992 by IEEE Computer Society Press, which pages are incorporated herein by reference.

Figure 10:
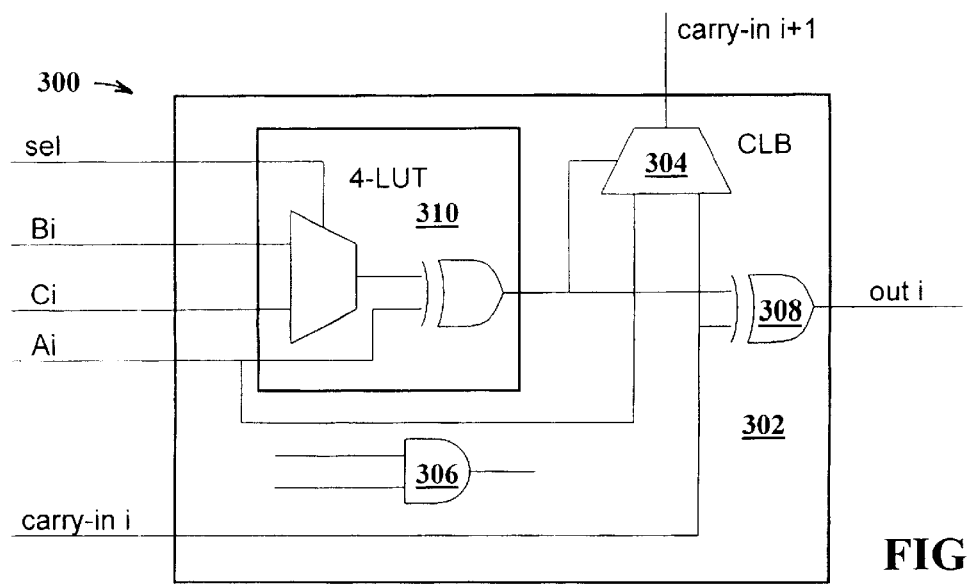
FIG. 10 illustrates an input select adder having the constituent adder and multiplexer remapped to a single CLB.

FIG. 10 illustrates an input select adder 300 having the constituent adder 202 and multiplexer 204 remapped to a single CLB 302. Multiplexer 304 and XOR gate 308 are unchanged from the mapping of adder 202. LUT 310, however, includes the combined logic of LUTs 206 and 222 of adder 202 and multiplexer 204, respectively.

LUT 310 implements the function: Ai XOR select (sel, Bi, Ci). It can be seen that the remap process has reduced resource usage from two CLBs 214 and 224 (FIGS. 8A and 8B) to one CLB 302 for a bit-slice of the input select adder. In addition, the remap template construct allowed specification of the input select adder using predefined logic modules, i.e., the adder and the multiplexer, thereby supporting logic reuse. Thus, the invention supports logic reuse and provides an expedient method for reducing the resources consumed by combined, reused logic modules.

While the invention has been described in the context of remapping logic modules on a CLB-by-CLB basis, those skilled in the art will recognize that the invention could be extended and applied to other levels of resources in a resource hierarchy. For example, remapping may be performed for a group of CLBs as compared to a single CLB. Thus, instead of considering whether the resources of a single CLB can cover a combinational sub-network defined by the child modules, the resources of multiple CLBs may be considered. The invention may also be applied to IOBs.

Accordingly, the present invention provides, among other aspects, a process for remapping predefined logic modules used in a design. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for remapping logic modules to resources of a programmable gate array, comprising:

specifying one or more connections between at least two logic modules, each module having a respective floorplan that includes a set of circuit elements;

comparing a first set of resources of the programmable gate array to a second set of resources required by the sets of circuit elements; and combining the floorplans of the logic modules into a single floorplan that maps to the first set of resources if the first set of resources covers the second set of resources.

2. The method of claim 1, wherein the circuit elements are configurations of configurable logic blocks of the programmable gate array.

3. The method of claim 1, further comprising specifying in a design file a remap template for the logic modules.

4. The method of claim 1, wherein each set of circuit elements comprises one or more vectors having respective orientations and directions.

5. The method of claim 4, wherein the vectors have column orientations.

6. The method of claim 4, wherein the vectors have row orientations.

7. The method of claim 1, wherein the first and second sets of resources include lookup tables.

8. The method of claim 1, wherein the first and second sets of resources include AND gates.

9. The method of claim 1, wherein the first and second sets of resources include XOR gates.

10. The method of claim 1, wherein the first and second sets of resources include multiplexers.

11. The method of claim 1, further comprising:

constructing a template of resources that covers each of the logic modules; and testing for contention by the logic modules for the resources in the template of resources.

12. The method of claim 11, further comprising evaluating the size, shape, and relative location of the logic modules.

13. The method of claim 11, further comprising:

constructing respective tile matrices for the logic modules, each tile matrix comprising one or more tiles, and each tile including one or more cells whose values represent whether an associated resource is required, wherein each of the tile matrices are similarly arranged in size and shape; and comparing corresponding ones of the cells of the tile matrices.

14. The method of claim 13, wherein the circuit elements are configurations of configurable logic blocks of the programmable gate array.

15. The method of claim 14, wherein each set of circuit elements is comprised of one or more vectors having respective orientations and directions.

16. The method of claim 15, wherein the vectors have column orientations.

17. The method of claim 15, wherein the vectors have row orientations.

18. The method of claim 14, wherein the first and second sets of resources include lookup tables.

19. The method of claim 18, wherein the first and second sets of resources include AND gates.

20. The method of claim 19, wherein the first and second sets of resources include XOR gates.

21. The method of claim 20, wherein the first and second sets of resources include multiplexers.

* * * * *